(12) United States Patent
Wang et al.

(10) Patent No.: US 9,077,182 B2
(45) Date of Patent: Jul. 7, 2015

(54) METHOD FOR ESTIMATING STATE OF CHARGE FOR LITHIUM-ION BATTERIES

(71) Applicant: Mitsubishi Electric Research Laboratories, Inc., Cambridge, MA (US)

(72) Inventors: Yebin Wang, Acton, MA (US); Huazhen Fang, La Jolla, CA (US); Zafer Sahinoglu, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 325 days.

(21) Appl. No.: 13/752,666

(22) Filed: Jan. 29, 2013

(65) Prior Publication Data
US 2014/0210418 A1 Jul. 31, 2014

(51) Int. Cl.
*H02J 7/00* (2006.01)
*G01R 31/36* (2006.01)
*H01M 10/0525* (2010.01)

(52) U.S. Cl.
CPC ............. *H02J 7/00* (2013.01); *G01R 31/3651* (2013.01); *G01R 31/3624* (2013.01); *H01M 10/0525* (2013.01)

(58) Field of Classification Search
USPC .................................................. 320/132, 134
See application file for complete search history.

(56) References Cited

U.S. PATENT DOCUMENTS

| 6,356,083 | B1 | 3/2002 | Ying |
| 6,556,020 | B1 | 4/2003 | McCabe et al. |
| 7,352,156 | B2 | 4/2008 | Ashizawa et al. |
| 7,443,139 | B2 | 10/2008 | Mitsui et al. |
| 8,207,706 | B2 | 6/2012 | Ishikawa |
| 8,242,738 | B2 | 8/2012 | Barsukov |
| 2013/0006455 | A1 | 1/2013 | Li |

OTHER PUBLICATIONS

Santhanagopalan S. et al.: "Online Estimation of the State of Charge of a Lithium Ion Cell," Journal of Power Sources, Elsevier SA, CH, vol. 161, No. 2, Oct. 27, 2006.
Samadi et al.: "An Electrochemical Model-Based Particle Filter Approach for Lithium-ion Battery Estimation," Decision and Control (CDC), 2012 IEEE 51st Annual Conference on, IEEE. Dec. 10, 2012, p. 3074-3079.

*Primary Examiner* — Sun Lin
(74) *Attorney, Agent, or Firm* — Dirk Brinkman; Gene Vinokur

(57) ABSTRACT

A state of charge (SoC) a lithium-ion (Li+) battery is estimated at a time instant by first constructing a battery model of the Li+ battery based on a single particle operation. The battery model describes a relationship between the SoC, a charge current, a discharge current, and an output voltage of the Li+ battery. Using a nonlinear optimization, a function expressing a relationship between the SoC and an open circuit voltage of the Li+ battery is determined. The relationship is based on off-line measurements of the charge current, the discharge current, and the open-circuit voltage of the Li+ battery. Then, the SoC and parameters of the battery model are estimated concurrently, wherein the SoC and the parameters are estimated based on the battery model, the function, and on-line measurements of the charge current, the discharge current, and the output voltage.

15 Claims, 8 Drawing Sheets

100

200

300

Variables

| | |
|---|---|
| $\Phi_s$ | electric potential in the solid electrode |
| $\Phi_e$ | electric potential in the electrolyte |
| $c_s$ | concentration of Li$^+$ in the solid electrode |
| $c_{ss}$ | concentration of Li$^+$ at a particle's spherical surface |
| $J$ | molar flux of Li$^+$ at the particle's surface |
| $J_0$ | exchange current density |
| $\eta$ | overpotential of reaction in the cell |
| $U$ | open-circuit potential |
| $I$ | external circuit current |
| $V$ | terminal voltage |

Physical parameters

| | |
|---|---|
| $D_s$ | diffusion coefficient of Li$^+$ in the solid electrode |
| $\bar{r}$ | radius of the spherical particle |
| $F$ | Farady's constant |
| $S$ | specific interfacial area |
| $T$ | temperature of the cell |
| $\alpha^a$ | anodic charge transport coefficient |
| $\alpha^c$ | cathodic charge transport coefficient |
| $R$ | universal gas constant |
| $R_c$ | phase resistance |
| $R_f$ | film resistance of the solid electrolyte interphase |

Subscripts

| | |
|---|---|
| $s$ | solid electrode phase |
| $e$ | electrolyte phase |
| $n$ | negative electrode |
| $p$ | positive electrode |
| $j$ | $n$ or $p$ |

*Fig. 5*

METHOD FOR ESTIMATING STATE OF CHARGE FOR LITHIUM-ION BATTERIES

FIELD OF THE INVENTION

This invention relates generally to lithium-ion batteries, and more generally to estimating a state of charge (SoC) and parameters for the batteries.

BACK GROUND OF THE INVENTION

Lithium-ion (Li+) batteries have a high energy density, wide temperature range, small size, superior power performance and durability, no memory effect, and no loss of charges when not in use when compared with other batteries. Battery management systems (BMS) can be used to monitor the battery status and regulate charging and discharging processes for real-time battery protection and performance improvement. The BMS can estimate a state of charge (SoC). The SoC is a ratio of the current capacity to the maximum capacity of the battery.

Two conventional SoC estimation methods are voltage translation, and Coulomb counting. Voltage translation directly converts a measured voltage to an estimard SoC. Coulomb counting infers the SoC from open circuit voltage (OCV)-SoC data for instance U.S. Pat. No. 7,443,139, U.S. Pat. No. 6,556,020, U.S. Pat. No. 6,356,083. The estimation requires the battery to be disconnected from a load making the estimation impractical for many applications. Coulomb counting can also be subject to drift due to cumulative integration errors, and noise corruption.

Model-based approaches can improve the estimation accuracy. Equivalent circuit models (ECM), which include virtual voltage source, internal resistance and a RC network to simulate battery dynamics, have been used for SoC estimation. For instance U.S. Pat. No. 8,111,037 discloses a method identifying a state of a battery from the difference (compared to a threshold) between battery voltages at different circumstances. U.S. Pat. No. 7,352,156 uses a linear parametric model to match measured the charge current and the terminal voltage of a second battery to estimate the open-circuit voltage, from which the SoC is inferred on the basis of a prestored table. These methods are intuitive and the performance is difficult to analyze. An extended Kalman filter (EKF) can be applied to the ECM to estimate the SoC with approximate dynamic error bounds. The estimation results can be improved using a sigma-point Kalman Filter (SPKF), which has better accuracy and numerical stability. Other nonlinear observer design approaches have also been used to for ECM based nonlinear SoC estimators. For instance, US2013/0006455 discloses a method using adaptive observer to estimate the OCV and parameters of the ECM, then the predetermined OCV-SoC curve is used to determine the estimation of the SoC. The disclosed method has limitations, such as linearization-based technique is used thus difficult to ensure the quality of the estimation of the SoC.

Another type of battery model is based on electro-chemical principles that describe intercalation and diffusion of the lithium ions, and conservation of charge in the battery. Such electrochemical models ensure that each model parameter retains a proper physical meaning. However, such models have a complex structure based on partial differential equations (PDEs), often necessitating model simplification, or reduction. A linear reduced-order electrochemical model can be used with conventional KF SoC estimation.

An extended KF (EKF) can be implemented based on a nonlinear ordinary differential equation (ODE) model obtained from the PDEs by finite-difference discretization. An unscented Kalman filter (UKF) can be used to avoid model linearization for more accurate SoC estimation. Various of existing estimation approaches suffer from the incapability to estimate the SoC with guaranteed convergence, which means the quality of the estimated SoC is not ensured.

U.S. Pat. No. 8,242,738 describes determining battery parameters of the ECM following active operation of the battery. The parameters are determined by fitting recorded or on-line voltage response to a model function. The model function describes the equivalent circuit voltage response to the load transition using equivalent circuit parameters. The model can be used for SOC correlation, and to improve the accuracy of the prediction of on-line for devices that drain the battery in short high-current pulses.

U.S. Pat. No. 8,207,706 describes a method for estimating the SoC. The method provides measured and estimated cell terminal voltage to a model coefficient updater to update a model coefficient. A multi-layer model determines the SoC for layers of the electrodes.

SUMMARY OF THE INVENTION

The embodiments of the invention provide a method for estimating a state of charge (SoC) of a lithium-ion (Li+) battery jointly with unknown battery parameters while the battery is operating.

The embodiments are based on an electrochemical single particle model (SPM). The SoC and parameters are estimated in two stages. During the first stage, partial model parameters are identified from a measured open circuit voltage (OCV)-SoC data by solving a nonlinear optimization problem. During the second stage, the SoC and the rest model parameters are estimated. The second stage can be performed by two embodiments. One embodiment uses an iterated extended Kalman filter (IEKF). The other embodiment uses a nonlinear adaptive estimator which leads to guaranteed stability of the estimation error of the SoC and the model parameters under certain conditions, i.e., the estimated SoC and model parameters convergers to the true SoC and model parameters. Because the nonlinear adaptive estimator design addresses the nonlinearity of the battery model instead of linearization of the battery model which necessarily introduces model mistach and requires a good guess of the initial SoC, the nonlinear adaptive estimator can provide a convergent estimation of the SoC with a large deviation of the initial SoC.

BRIEF DESCRIPTION OF THE DRAWINGS

FIG. 5 is a table of variables, parameters, and subscripts that are used by embodiments of the invention;

DETAILED DESCRIPTION OF THE PREFERRED EMBODIMENTS

Battery Model

Figure 1:
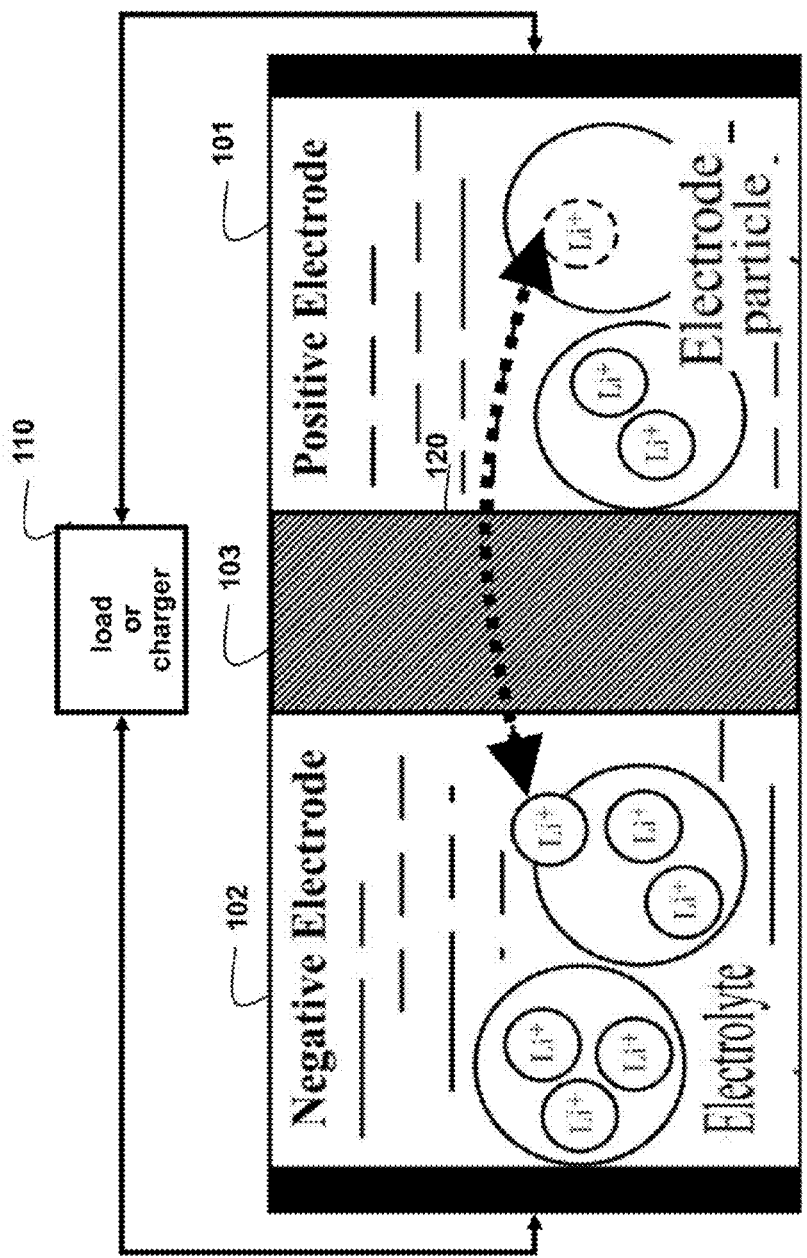
FIG. 1 is a schematic of a lithium-ion (Li+) battery and its operation as used by embodiments of the invention.

FIG. 1 shows a schematic of a lithium-ion (Li+) battery 100 that can use embodiments of the invention. A positive electrode 101 is e.g., a metal oxide, a polyanion, or spinel. Small solid particles of the compounds are compressed to provide a porous structure. A negative carbon electrode 102, which usually contains graphite particles, is also porous. The interstitial pores at both electrodes provide intercalation space, where the Li+ ions can be stored. The non-aqueouse electrolyte contains free ions and is electrically conductive. A separator 103 is arranged between the electrodes. The separator enables the exchange of Li+ ions from one side to the other, without passing electrons. Thus, electrons must either flow through a load or charger 110.

When the battery is charging, the Li+ ions are extracted 120 from the particles at the positive electrode into the electrolyte, driven by a reaction at a solid particle-electrolyte interface, and the particles at the negative electrode absorb the Li+ ions from the electrolyte. This process generates an influx of Li+ ions within the battery, and increases a potential difference between the positive and negative electrodes. When the process is reversed, the battery is discharging.

The chemical reactions at the positive and negative electrodes are, respectively, described by

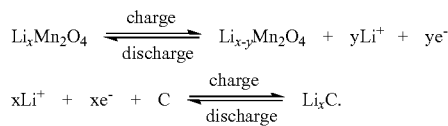

Single Particle Model

Figure 2:
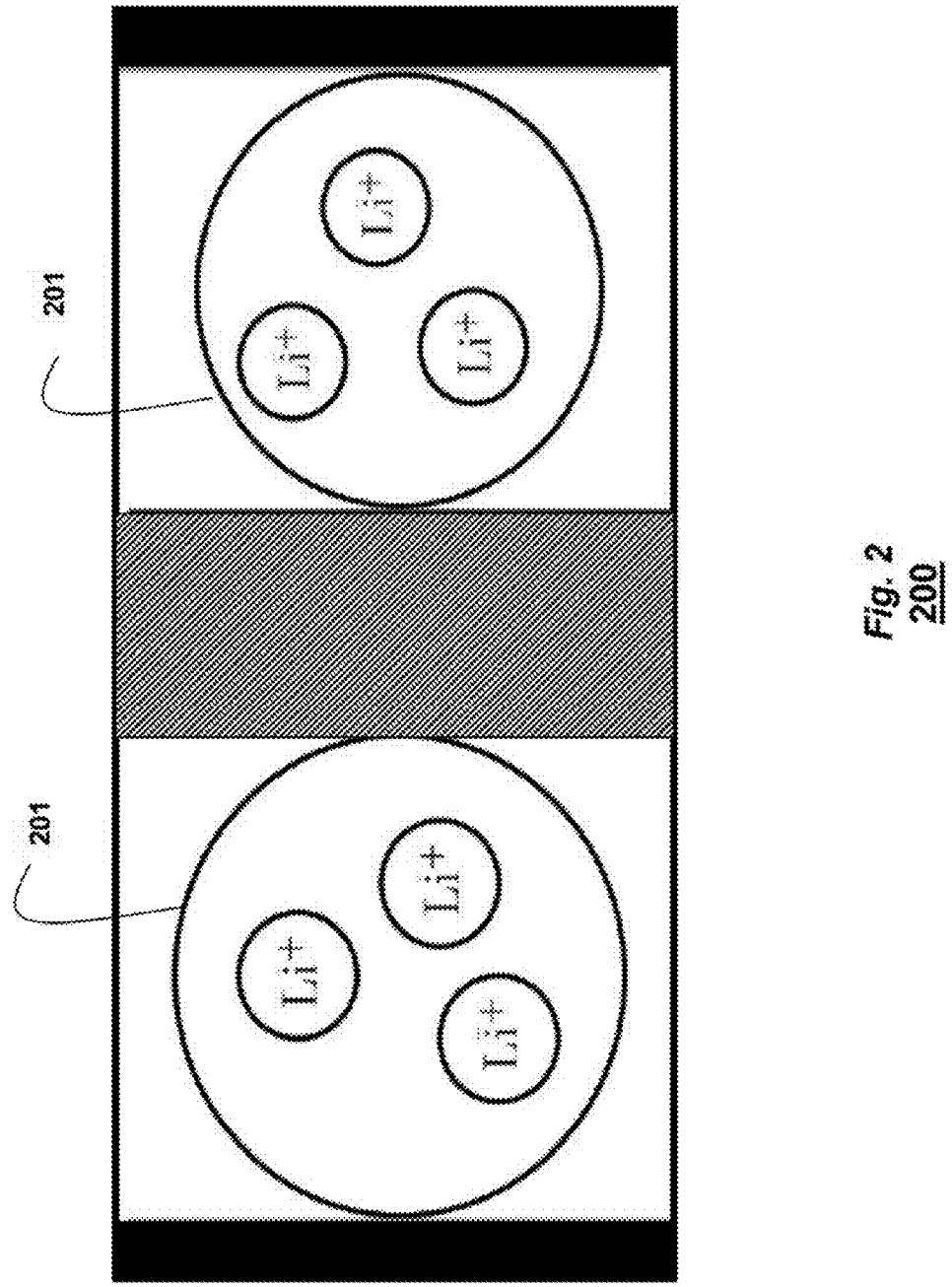
FIG. 2 is a schematic of a single-particle model for the battery of FIG. 1.

As shown in FIG. 2, the embodiments of the invention are based on a single particle model (SPM) 200, which simplifies each electrode as a spherical particle 201 with an area equivalent to the active area of the electrode. With the SPM, the effects of the Li+ ions in the electrolyte are ignored. Although unable to model all physical and chemical processes in batteries, this model decreases complexities in identification, estimation and control design for the embodiments of the invention.

General SoC Estimation Method

Figure 3:
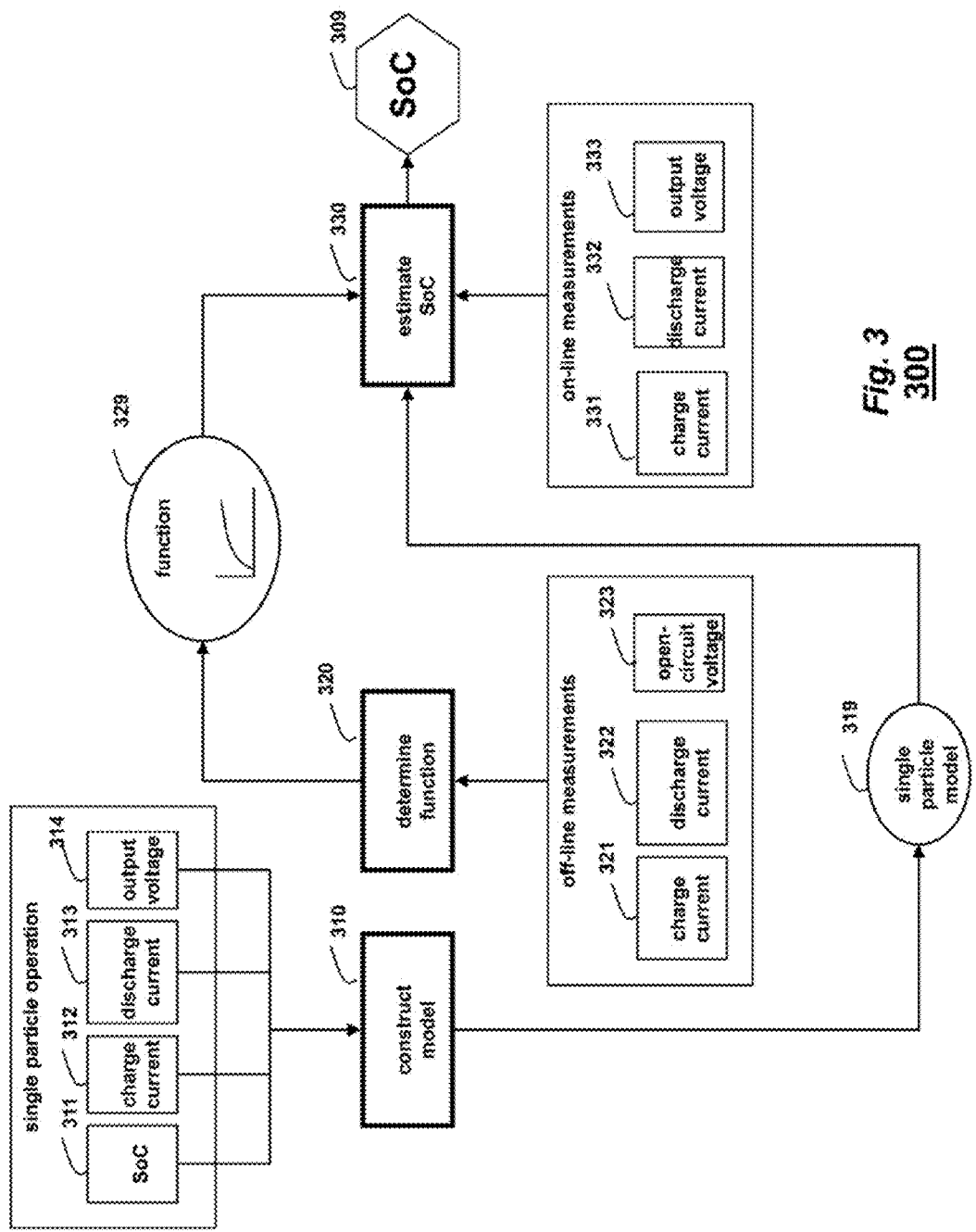
FIG. 3. is a flow diagram of a general method for estimating the state of charge (SoC) of the Li+ battery of FIG. 1.

FIG. 3 shows a method 300 for estimating a state of charge (SoC) 309 a lithium-ion (Li+) battery at a time instant according to embodiments of our invention.

Model Construction

We construct 310 a model 319 of the Li+ battery. The model is based on a single particle operation of the Li+ battery. The model describes a relationship between the SoC 311, a charge current 312, a discharge current 312, and an output voltage 314.

Off-line Operation

Then, we determine 320 a function 329 expressing a relationship between the SoC and an open circuit voltage. The function is based on measurements of an off-line operation of the Li+ battery. The relationship is based on the off-line measurement of the charge current 321, the discharge current 322, and the open circuit voltage (OSV) 323.

On-line Operation

Lastly, we estimate 330 the SoC. The SoC estimation is based on the model, the function, and measurements of an on-line operation of the Li+ battery of the charge current 331, the discharge current 332, and the output voltage 333.

Figure 4:
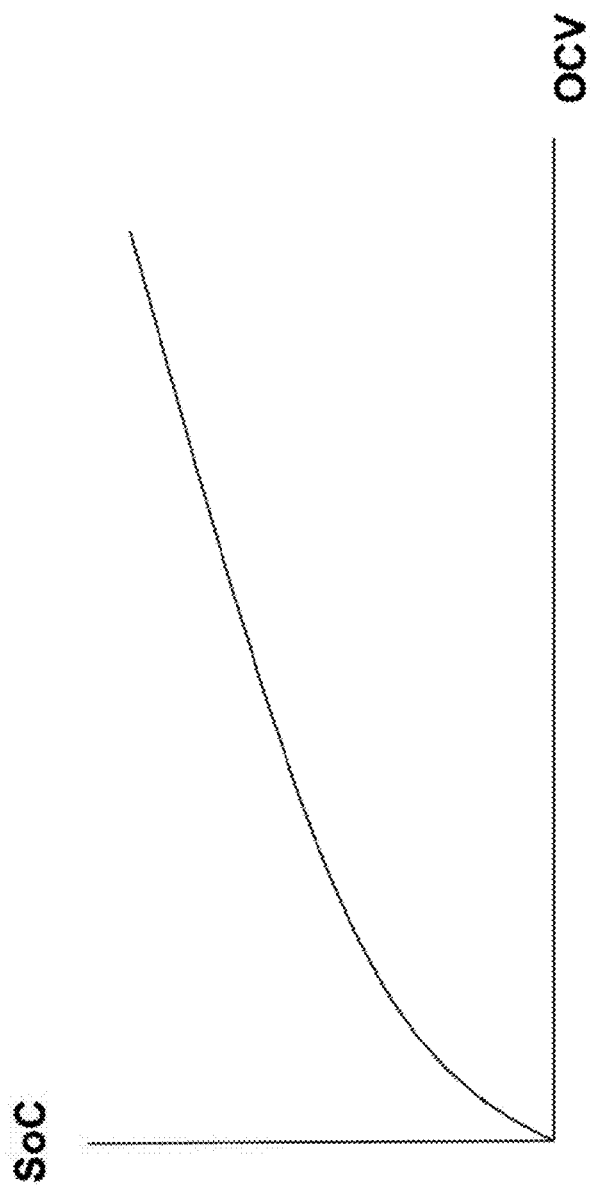
FIG. 4 is a graph showing a relations ship between the SoC and an open circuit voltage.

FIG. 4 shows an example the function of the relationship between the SoC and the OCV).

The steps of the above method, and any other process described herein can be performed in a processor, microprocessor, and the like, connected to a memory and input/output interfaces as known in the art. The processor can be co-located or part of the load. For example, the load is a hand-held device, such as a mobile telephone or computational device powered by the Li+ battery.

FIG. 5 is a table of various variables, parameters, and subscripts that are relates to battery functions and embodiments for estimating the SoC as described herein.

First Embodiment Method for Estimating SoC

Figure 6:
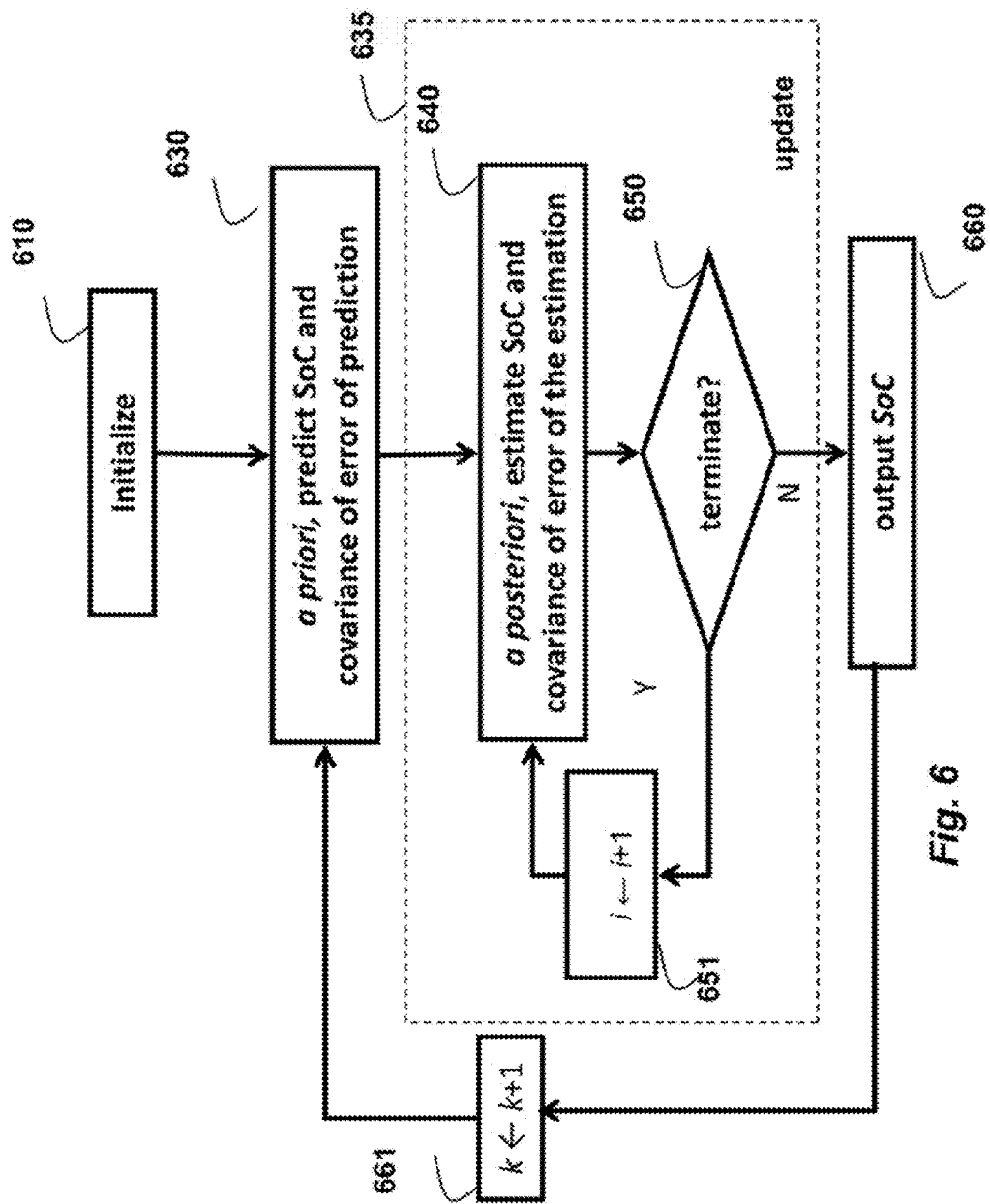
FIG. 6 is a flow diagram of a method for estimation the SoC according to embodiments of the invention.

FIG. 6 shows an embodiment of the estimating step 330. This embodiment uses an iterated extended Kalman filter (IEKF). The index k is for each time instant the SoC is estimated.

The method has a recursive structure for sequential implementation of prediction and update steps. The update 635 is iterative.

Before the iterations commence, variables, typically values of the SoC and model parameters at initial time instant used by the method, are initialized 610.

A priori, we predict 630 the SoC and a covariance of an error of the prediction based on the initial values of the SoC and parameters, a measured charge and discharge current, and the battery model.

A posteriori, we estimate 640 the SoC and a covariance of an error of the estimation based on the predicted SoC and the covariance of an error of the prediction, and a measured terminal voltage of the battery, and the battery model.

A termination condition is checked 650, and if true (Y), the iteration stops and outputs 660 the current SoC at time instant k, otherwise iterate 651 at step 640. The termination condition can be a fixed number of iterations i.

On termination of the update procedure, repeat the estimation of the SoC for the next $k^{th}$ time instant at step 630. The details of the method are described below.

Input and Output of the Battery

An input to the battery is a current I(t) with I(t)<0 while charging, and I(t)>0 while discharging. The terminal voltage is a potential difference between the two electrodes 101-102

$$V(t)=\Phi_{s,p}(t)-\Phi_{s,n}(t). \qquad (1)$$

Conservation of Li+ in the Electrode Phase

The migration of Li+ ions inside the particle 102 is caused by a gradient-induced diffusion. From Fick's laws of diffusion, $$\frac{\partial c_{s,j}(r,t)}{\partial t} = \frac{1}{r^2}\frac{\partial}{\partial r}\left(D_{s,j}r^2\frac{\partial c_{s,j}(r,t)}{\partial r}\right), \qquad (2)$$

with the initial and boundary conditions $$c_{s,j}(r,0) = c_s^0,$$

$$\left.\frac{\partial c_{s,j}}{\partial r}\right|_{r=0} = 0,$$

$$\left.\frac{\partial c_{s,j}}{\partial r}\right|_{r=r_j} = -\frac{1}{D_{s,j}}J_j.$$

The molar flux at the electrode/electrolyte interface of the single particle is $J_j$ where j=n and p, respectively, $$J_n(t) = \frac{I(t)}{FS_n},$$

$$J_p(t) = -\frac{I(t)}{FS_p}.$$

Electrochemical Kinetics

The molar flux $J_j$ is governed by Butler-Volmer equation $$J_j(t) = \frac{J_{0,j}}{F}\left[\exp\left(\frac{\alpha_a F}{RT}\eta_j(t)\right) - \exp\left(-\frac{\alpha_c F}{RT}\eta_j(t)\right)\right], \quad (3)$$

where $\alpha_a$, $\alpha_c$, F, R, T are constant, and $\eta_j(t)$ is $$\eta_j(t) = \Phi_{s,j}(t) - \Phi_{e,j}(t) - U(c_{ss,j}(t)) - FR_{f,j}J_j(t).$$

The Butler-Volmer equation models electrochemical kinetics and the flow of electrical current based on the electrode potential, considering that both a cathodic and an anodic reaction occur on the same electrode.

The electrolyte phase can be represented by a resistor $R_{c,j}$ in the SPM so that $\Phi_{c,j}$ can be expressed as $\Phi_{e,j}(t) = R_{c,j}I(t)$. Hence, $\eta_j$ becomes $$\eta_j(t) = \Phi_{s,j}(t) - U(c_{ss,j}(t)) - F\overline{R}_j J_j(t), \quad (4)$$

where $\overline{R}_j = R_{c,j} + R_{f,j}$.

The SPM is composed of Eqns. (1-3), in which I is the input current, $c_{s,j}$ and $\Phi_{s,j}$ are the variables of the battery status, and V is the output voltage according to our model.

Reduced Complexity Model

Average Li+ Concentration in the Electrode Phase

In the reduced complexity model, an average concentration of Li+ ions in the electrodes the battery present a state of the SoC, i.e., the current capacity of the battery. For an electrode particle, this is $$c_{s,j}^{avg}(t) = \frac{1}{\Omega}\int_\Omega c_{s,j}(r, t) d\Omega, \quad (5)$$

where $\Omega$ denotes the sperical volume of the particle. From Eqn. (2), $$\dot{c}_{s,j}^{avg}(t) = \frac{1}{\Omega}\int \Omega \frac{\partial c_{s,j}(r,t)}{\partial t} d\Omega, \quad (6)$$

$$= \frac{1}{\Omega}\int_\Omega \frac{1}{2}\frac{\partial}{\partial r}\left(D_{s,j}r^2 \frac{\partial c_{s,j}(r,t)}{\partial r}\right) d\Omega.$$

$$= \varepsilon_j D_{s,j} \frac{\partial c_{s,j}(r,t)}{\partial r}\bigg|_{r=r_j},$$

where $\varepsilon_j$ is a constant coefficient. Depending on the electrode polarity, Eqn. (6) is partitioned into $$\dot{c}_{s,n}^{avg}(t) = -\frac{\varepsilon_n}{FS_n}I(t), \text{ or} \quad (7)$$

$$\dot{c}_{s,p}^{avg}(t) = -\frac{\varepsilon_p}{FS_p}I(t). \quad (8)$$

From Eqns. (7-8), the rate of change of $c_{s,j}^{avg}$ is linearly proportional to the input current I. In other words, $c_{s,j}^{avg}$ equal to the initial value $c_{s,j}^{avg}(0)$ plus integration of I over time. This indicates that the change of SoC depends linearly on the current I as a result of $c_{s,j}^{avg}$ indicating the SoC. This particular relationship is novel, and not present in conventional electrochemical battery models.

Terminal Voltage

A function $\phi$ is define such that $c_{ss,j}(t) = \phi(c_{s,j}^{avg}(t))$, and $\overline{U} = U \circ \phi$, where 'o' denotes composition of two functions. Using Eqn. (4), Eqn. (1) becomes $$V(t) = \overline{U}(c_{s,p}^{avg}(t)) - \overline{U}(c_{s,n}^{avg}(t)) + \eta_p(t) - \eta_n(t) + (\overline{R}_p - \overline{R}_n)I(t).$$

With $\alpha_a = \alpha_c = 0.5$, it follows from Eqn. (3) that $$\eta_n(t) = \frac{2RT}{F}\sinh^{-1}\left(\frac{J_n(t)F}{2J_{0,n}}\right) = \frac{2RT}{F}\sinh^{-1}\left(\frac{\varepsilon_n I(t)}{2J_{0,n}}\right),$$

$$\eta_p(t) = \frac{2RT}{F}\sinh^{-1}\left(\frac{J_p(t)F}{2J_{0,p}}\right) = \frac{2RT}{F}\sinh^{-1}\left(\frac{\varepsilon_p I(t)}{2J_{0,p}}\right).$$

Thus, V(t) becomes $$V(t) = \overline{U}(c_{s,p}^{avg}) - \overline{U}(c_{s,n}^{avg}) + \quad (9)$$
$$\frac{2RT}{F}\left[\sinh^{-1}\left(-\frac{\varepsilon_p I(t)}{2J_{0,p}}\right) - \sinh^{-1}\left(\frac{\varepsilon_n I(t)}{2J_{0,n}}\right)\right] + (\overline{R}_p - \overline{R}_n)I(t).$$

As such, V(t) has a first part is the open-circuit voltage (OCV) that relies on $\overline{U}(c_{s,j}^{avg})$, and a second part is the direct feedthrough from I to V.

Model Abstraction and Discussion

Eqns. (7-9) concisely characterize the dynamics of the battery. As described above, $c_{s,j}^{avg}$ is equivalent to the SoC. The SoC is denoted by a state variable $x \in [0,1]$. The input u and the output y of the model can be defined as u=I and y=V, respectively. Then, the following state-space model can be constructed on the basis of Eqns. (7-9):

$$\begin{cases} \dot{x}(t) = -au(t), \\ y(t) = h(x(t)) + g(u(t)), \end{cases} \quad (10a)$$

where '^' above the variable indicates the first derivative. Eqn. (10a) is discretized over time to $$\begin{cases} x_{k+1} = x_k - \alpha u_k, \\ y_k = h(x_k) + g(u_k), \end{cases} \quad (10b)$$

where k represents the $k^{th}$ step of discretization of time which corresponds to certain time instant $t_k$, h(•) is call the first function, and g(•) is called the second function.

In Eqns. (10), $\alpha$ is a positive parameter, h(•), which is the counterpart of the part containing $\overline{U}$ in Eqn. (9), that has the parametric form $$h(x) = \beta_0 \ln(x + \beta_1) + \beta_2,$$

where $\beta_i$, $0 \le i \le 2$ are the first set of parameters, and g(•) corresponding to the part involving I in Eqn. (9), expressed as $$g(u) = \gamma_0[\sin h^{-1}(\gamma_1 u) - \sin h^{-1}(\gamma_2 u)] + \gamma_3 u,$$

where $\gamma_i$ for i=0, 1, 2, 3, the second set of parameters, are from Eqn. (9).

For SoC estimation, the model in Eqn. (10b) contains parameters α, $\beta_i$'s and $\gamma_i$'s. However, accurate values for the parameters are often difficult to obtain when the model is applied to a specific battery, due to practical difficulties.

SoC Estimation

Hence, we use adaptive SoC estimation, which concurrently estimates the SoC and the unknown parameters. To accomplish the task, the following approach is used. As a first step, the OCV h(•) is determined using the SoC-OCV data to identify the parameters $\beta_i$'s. After h(•) is obtained, the state x(k), the parameters α and $\gamma_i$'s are estimated concurrently as a second step.

This identification in the first step is typically a nonlinear least squares data fitting problem, which can be solved by numerical methods, such as the Gauss-Newton method. Therefore, the $\beta_i$'s are assumed to be known in the second step. The nonlinear state and parameter estimation problem is described in further detail below.

Adaptive SoC Estimation Based on IEKF

The IEKF is a modified version of the KF and EKF to deal with nonlinearities in the system by iteratively refining the state estimate for the current state at each time instant k.

Model Augmentation

To use the IEKF, we augment 520 the state vector to incorporate both the original state x and the unknown parameters $$\xi_k = [x_k \alpha \gamma_0 \gamma_1 \gamma_2 \gamma_3]^T.$$

Variables $\xi_{i,k}$ for i=1, 2, ..., 6 representing the $i^{th}$ component of the vector $\xi_k$, and its corresponding variable or parameter are used interchangeably. Thus, Eqn. (10b) can be rewritten as $$\begin{cases} \xi_{k+1} = F_k \xi_k, \\ y_k = \bar{h}(\xi_k), \end{cases} \text{ where} \quad (11)$$

$$F_k = \begin{bmatrix} 1 & u_k & 1 & \\ & & & \ddots \\ & & & & 1 \end{bmatrix},$$

$$\bar{h}(\xi_k) = \beta_1 \log(\xi_{1,k} + \beta_2) + \beta_3 + \xi_{3,k} [\sinh^{-1}(\xi_{4,k} u_k) - \sinh^{-1}(\xi_{5,k} u_k)] + \xi_{6,k} u_k.$$

Application of IEKF

For the augmented battery model in Eqn. (11), the IEKF is applied to estimating $\xi_k$. Similar to the KF and EKF, the IEKF includes of two procedures, namely prediction and update, which are implemented recursively.

The prediction formulae of the IEKF are $$\hat{\xi}_{k|k-1} = F_{k-1} \hat{\xi}_{k-1|k-1}, \text{ and}$$

$$P_{k|k-1} = F_{k-1} P_{k-1|k-1} F_{k-1}^T + Q,$$

where $\hat{\xi}_{k|k-1}$ and $\hat{\xi}_{k|k}$ are the estimates of $\xi_k$ given $Y_{k-1}$ and $Y_k$, respectively, P is the estimation error covariance determined in step 640, and Q>0 is adjustable to reduce the effects of process noise.

The update 635 is iterative, for the ith iteration:

$$K_k^{(i)} = P_{k|k-1} H_k^{(i-1)} [H_k^{(i-1)} P_{k|k-1} H_k^{(i-1)T} + R]^{-1},$$

$$\hat{y}_k^{(i)} = \bar{h}(\hat{\xi}_{k|k}^{(i-1)}) - H_k^{(i-1)}(\hat{\xi}_{k|k-1} - \hat{\xi}_{k|k}^{(i-1)}),$$

$$\hat{\xi}_{k|k}^{(i)} = \hat{\xi}_{k|k-1} + K_k^{(i)}(y_k - \hat{y}_k^{(i)}),$$

where R>0, the superscript (i) denotes the iteration number and $$H_k^{(i)} = \left. \frac{\partial \bar{h}}{\partial \xi} \right|_{\hat{\xi}_{k|k}^{(i)}}.$$

The iterations terminate when a termination condition is reached, e.g. i achieves a pre-specified maximum iteration number $i_{max}$, or when the error between two consecutive iterations is less than a predetermined tolerance level. The associated prediction error covariance is determined 630 as $$P_{k|k} = (I - K_k^{i_{max}} H_k^{i_{max}}) P_{k|k-1}.$$

Then, the estimate of SoC is $\hat{\xi}_{1,k}$ and the estimate of the model parameters are $\hat{\xi}_{i,k}$ 2≤i≤6, respectively.

Regarding the SoC estimatiom, the following statements can be made:

Connection with EKF

When $i_{max}$=1, the IEKF degenerates to the EKF. When $i_{max}$≥1, the method makes linearization and searching near the current estimate iteratively to determine the best estimate. Thus, the method has enhanced estimation performance when nonlinearities are present.

Feasible Improvements to SoC Estimation

The update procedure 635 of the IEKF is equivalent to applying the Gauss-Newton method for determining the minimum of a mean-square-error cost function. The Gauss-Newton method can be improved, e.g., by the Levenberg-Marquardt algorithm with better convergence properties and numerical stability, to achieve better performance for the SoC estimation.

Potential Alternatives to SoC Estimation

The SoC is a joint state and parameter estimation using state augmentation, and the IEKF. We are motivated by conceptual simplicity, satisfying the SoC estimation performance validated by experimental on-line and off-line measurements and modest computational complexity. However, there are alternatives. State estimation techniques, such as UKF, particle filter and nonlinear Gaussian filter substitute the IEKF, and various methods for joint state and parameter estimation, e.g., expectation-maximization (EM) for nonlinear state estimation, set membership state and parameter estimation for nonlinear differential equations, and Bayesian particle filtering, can also be used.

Nonlinear Adaptive Estimation of the SoC and Parameters

The second embodiment of estimating the SoC and parameters relies on the battery model of equation (10a). Similar to the first embodiment, a two-stage estimation is used:

Stage 1: Because h(•) represents the OCV, h(.) is determined using the SoC-OCV data set, obtained offline, to identify parameters $\beta_i$.

Stage 2: After h(•) is obtained, the state x or the SoC, and parameters α, $\gamma_i$'s are estimated concurrently.

During stage 2, the parameters $\beta_i$ are treated as known and joint state and parameter estimation is performed using a nonlinear adaptive estimator.

The adaptive estimator design requires the model in a standard form as follows $$\dot{z} = Az + \phi(z, u, \theta),$$

$$y = Cz, \quad (12)$$

where (A,C) is in Brunovsky observer form, z is the state vector, θ is the unknown parameter vector, u is the input vector, and φ(z,u,θ) has a triangular dependence on z to enable high gain observer design.

Transformation of the Battery Model

The battery model of equation (10a) is clearly not in the form of equation (12) because the output is not a linear function of z. Therefore, a state transformation is needed to put equation (10a) into equation (12). To simplify the transformation and description, we assume g(u) in system equation (10a) has a linear parametrization. Specifically, we consider the following system $$\dot{x} = \alpha u,$$

$$y = \beta_1 \log(x+\beta_2) + \beta_3 + \gamma_1 u, \quad (13)$$

where x is the SoC of the battery, $\beta_i$ are known parameters, and $\gamma_1$, $\alpha$ are unknown parameters. The main purpose here is to teach how to design a nonlinear adaptive estimator based on the battery model in equation (10a). The way how to parameterize g(u) is not be limited to the case considered in this invention.

Putting equation (10a) into equation (12) requires the following parameter dependent transformation $$\xi(x,u,\gamma_1) = \beta_1 \log(x+\beta_2) + \beta_3 + \gamma_1 u, \quad (14)$$

where $\xi$ is the new state variable. We have $$\dot{\xi} = \beta_1 \frac{\alpha}{x+\beta_2} u + \gamma_1 \dot{u},$$

where $x+\beta_2$ is a function of $y,u,\gamma_1$, and is solved as $$x + \beta_2 = \exp\left(\frac{y - \beta_3 - \gamma_1 u}{\beta_1}\right).$$

We rearrange the transformed system and have $$\dot{\xi} = \phi(y,u,\gamma,\alpha) + \gamma_1 \dot{u},$$

$$y = \xi, \quad (15)$$

where $$\phi(\cdot) = \beta_1 \alpha \exp\left(\frac{\beta_3 + \gamma_1 u - y}{\beta_1}\right) u.$$

The SoC, represented by x, is always positive, also $x+\beta_2$ is positive when the model according to equation (13) is valid. One can verify that the state transformation (14) is a diffeomorphism over $x \in \mathfrak{R}^+$, i.e. the state transformation in equation (14) is well-defined in the domain where the model of equation (13) is physically meaningful.

The transformed system (15) is in the form of equation (12), where $$\varphi(y, u, \dot{u}, \gamma_1, \alpha) = \beta_1 \alpha \exp\left(\frac{\beta_3 + \gamma_1 u - y}{\beta_1}\right) u + \gamma_1 \dot{u}.$$

The transformed system (15) is nonlinearly parameterized. Clearly the state $\xi$, representing the OCV, external current input u, and model parameters $\gamma_1$, $\alpha$ are bounded in a compact set D.

Nonlinear Adaptive Estimator

We consider the system represent by the following equation $$\dot{\hat{\xi}} = \theta(y - \hat{y}) + \hat{\varphi} + \theta \Upsilon \dot{\hat{\rho}}, \quad (16)$$

$$\dot{\Upsilon} = -\theta \Upsilon \frac{\partial \hat{\varphi}}{\partial \hat{\rho}},$$

$$\dot{\hat{\rho}} = \theta P \Upsilon^T (y - \hat{y}),$$

$$\dot{P} = -\theta P \Upsilon^T \Upsilon P + \theta P,$$

where $\rho = [\alpha, \gamma_1]^T$, $\hat{\rho} = [\hat{\alpha}, \hat{\gamma}_1]^T$, $\hat{\varphi} = \phi(\hat{\xi}, \hat{\alpha}, u)$, and $\theta$ is a sufficiently large positive constant. Particularly, we call the dynamics of Y, P as an auxiliary filter, the dynamics of $\hat{\rho}$ as a parameter estimator, and the dynamics of $\hat{\xi}$ as a state estimator.

If the input u is such that for any trajectory of system (16), then Y(t) are persistently exciting, i.e., there exist $\delta_1, \delta_2, T > 0$, for any $t \geq 0$, the following inequalities hold $$\delta_1 I_2 \leq \int_t^{t+T} \Upsilon^T(t) \Upsilon(t) d\tau \leq \delta_2 I_2, \quad (17)$$

where $I_2$ is a 2×2 identity matrix. Then, the nonlinear adaptive estimator is designed as system (15), which provides exponentially convergent estimator of the SoC and parameters. If the energy of the signals $\|\partial \hat{\varphi}/\partial \hat{\alpha}\|$, $\|\partial \hat{\varphi}/\partial \hat{\gamma}_1\|$ defined over over period [t, t+7] are nonzero, then the system in equation (16) is persistently excited when these two signals are linearly independent, or $$\frac{\partial \hat{\varphi}}{\partial \hat{\alpha}} = k \frac{\partial \hat{\varphi}}{\partial \hat{\gamma}_1}, \forall k \in R, t \in [t, t+T].$$

Effect of the Invention

It is well known that Lithiumion battery dynamics are very complicated, and involve numerous micro-scale electrochemical processes. Yet, our SoC estimation is accurate, even in the presence of model errors. This is an advantage because no model is perfect. Although our reduced complexity model expresses the major phenomena during charging and discharging, there still are unmodeled dynamics, including ignored electrochemical effects, uncertainties, noise, etc.

Our battery model modified from Eqn. (10b) is $$\begin{cases} x_{k+1} = x_k - \alpha u_k + d_k, \\ y_k = h(x_k) + g(u_k), \end{cases} \quad (18)$$

where $d_k$ is a general characterization of the unmodeled, unknown process dynamics. When applied to Eqn. (18), the SoC estimation is considerably tolerant towards $d_k$, which can be accounted for by the following reasons.

Because the parameters $\alpha$ and $\gamma_i$'s are adjusted dynamically, the parameters can be adapted to the measurement data to counteract the effects of model mismatch. In this case, the parameter estimates can deviate, but are still sufficiently accurate. The SoC, or $x_k$, is strongly observable compared to the parameters $\alpha$ and $\gamma_i$'s. This helps to estimate $x_k$ even when a model mismatch exists.

Figure 7:
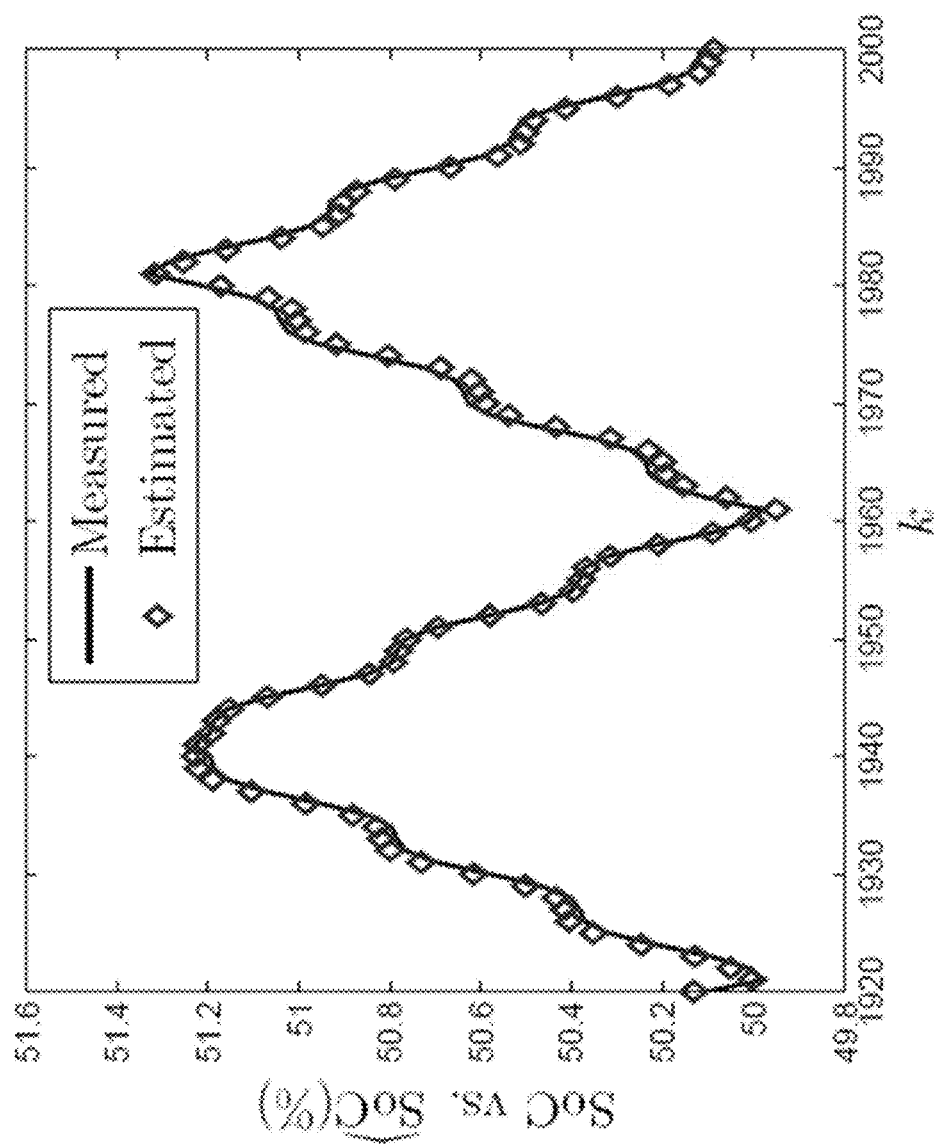
FIG. 7 is a graph comparing measured and estimated state of charge according to embodiments of the invention.

FIG. 7 shows comparable measured and estimated SoC estimates (SoC vs. $\widehat{SoC}$) over two charge and discharge cycles, e.g., time instances 1920-2000.

Figure 8:
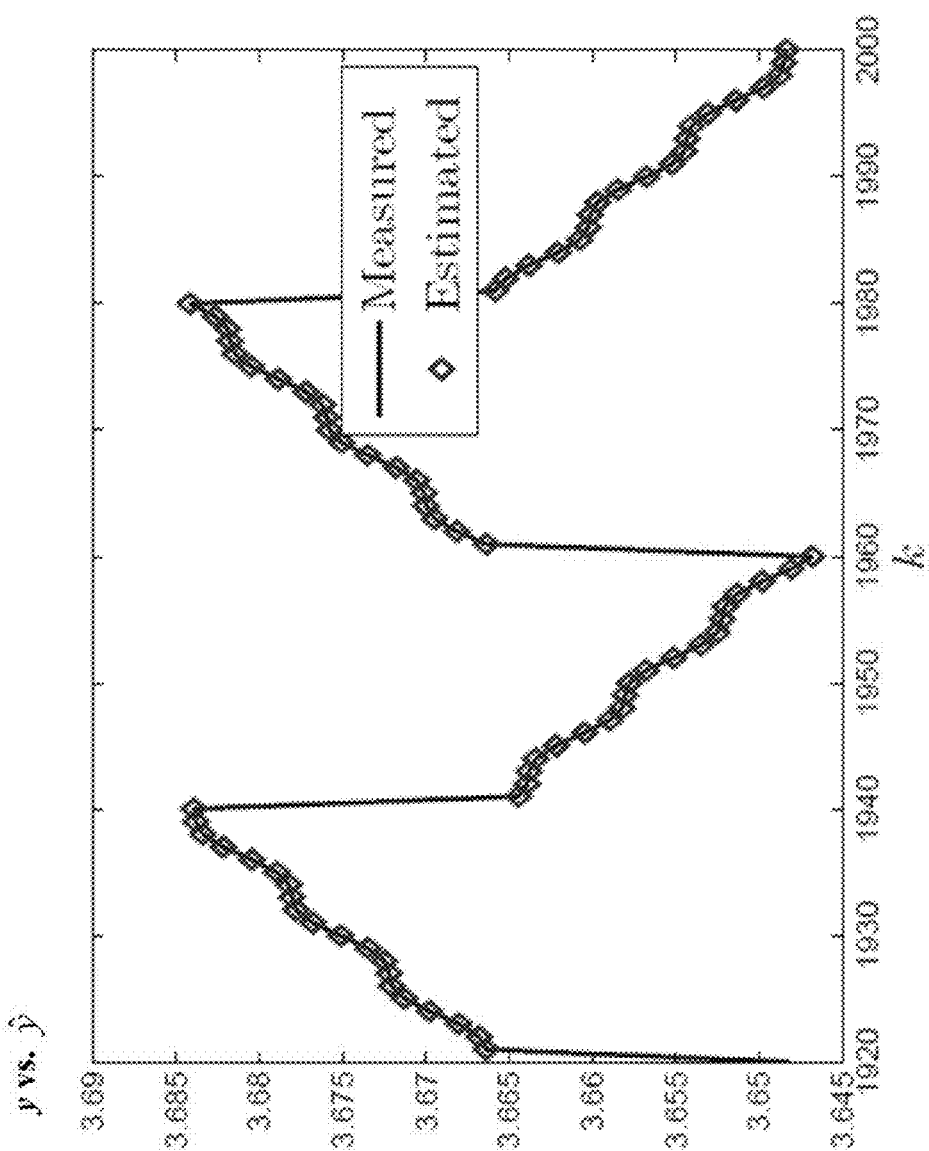
FIG. 8 is a graph comparing measured and estimated output voltages according to embodiments of the invention.

FIG. 8 shows comparable measured and estimated output voltages (y and ŷ) at k times instances.

Instead of using a model for SoC estimation of Lithium-ion (Li+) batteries, the embodiments of the invention uses an adaptive estimation method, which combines SoC estimation and parameter identification. The method is based on a reduced complexity model for Li+ batteries derived from a single particle model.

Joint observability and identifiability of the SoC, and the unknown parameters of the model are analyzed to show the advantageous property that the SoC is strongly observable.

Based on the analysis, an IEKF based adaptive SoC estimator method is provided, which is accurate in the presence of model errors.

Prior art estimations typically linearizes of the model, and thus fail to estimate the SoC and parameters accurately, because convergence of the estimation error of the SoC and model parameters is not guaranteed. Our method, which uses a nonlinear adaptive estimator, overcomes these limitations.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for estimating a state of charge (SoC) a lithium-ion (Li+) battery at a time instant, comprising steps of:
   measuring a charge current, a discharge current, an open circuit voltage (OCV), and an output voltage during an off-line operation of the Li+ battery;
   constructing a battery model of the Li+ battery, wherein the battery model is constructed based on a single particle operation of the Li+ battery, where the battery model describes a relationship between the SoC, the charge current, the discharge current;
   determining, using a nonlinear optimization, a function expressing a relationship between the SoC and the OCV of the Li+ battery, wherein the relationship is based on off-line measurements of the measuring the charge current, the discharge current, and the OCV; and
   estimating the SoC and parameters of the battery model concurrently, wherein the SoC and the parameters are estimated based on the battery model, the function, and on-line measurements of the charge current, the discharge current, and the OCV, wherein the steps are performed in a processor connected to the Li+ battery.

2. The method of claim 1, wherein an average concentration of Li+ ions in electrodes of the Li+ battery represents a state of the SoC; and the constructing further comprises:
   determining dynamics of the average concentration of the Li+ ions as a state equation, based on the battery model.

3. The method of claim 2, wherein the dynamics of the average concentration is $$\dot{x}(t) = -au(t)$$

where $\dot{x}(t)$ is the average concentration or the SoC, a is a charge and discharge coefficient, U(t) is the charge and discharge current.

4. The method of claim 1, wherein the determining further comprising
   defining the output voltage as a first function of the SoC, and a second function of the charge and discharge current;
   parameterizing the first function using a first set of parameters;
   selecting a cost function as a measure of an error between the measured OCV and a predicted OCV, which is computed by the first function using the measured SoC; and
   minimizing the cost function to determine values of the first set of parameters.

5. The method of claim 4, wherein the minimizing solves a nonlinear optimization problem.

6. The method of claim 2, wherein the estimating further comprises:
   augmenting the state equation by including dynamics of parameters to produce augmented dynamics, wherein the dynamics of the parameters is represented by $\dot{\xi}(t)=0$, wherein $\xi$ represent unknown parameters of the battery model, and t represents time;
   predicting a priori, the SoC, and the parameters;
   determining a covariance of an error of off-line measurements of the measuring based on the predicted SoC and the parameters;
   estimating, a posteriori, the SoC, and the parameters;
   calculating a covariance of an error of estimation of the estimating, based on the estimated SoC, and the parameters; and
   repeating the predicting, the determining, the estimating, and the calculating.

7. The method of claim 1, wherein the estimating further comprises:
   transforming the battery model in a standard form; and
   determining a nonlinear adaptive estimator to produce the estimated SoC and parameters based on a transformed system.

8. The method of claim 7, wherein the nonlinear adaptive estimator includes an auxiliary filter based on the transformed battery model, the measured discharge current, and the charge current and its time derivatives, and the output voltage, to produce auxiliary signals, a parameter estimator, based on the measured and estimated terminal output voltages, and the auxiliary signals, to produce the estimated parameters of the battery model, and a state estimator, based on the measured discharge and charge current, the measured terminal output voltages, the transformed battery model, the auxiliary signals, and the estimated parameters, to produce the estimated SoC.

9. The method of claim 7, wherein the transforming is a state transformation.

10. The method of claim 8, wherein the state estimator and the parameter estimator are described by differential equations, respectively.

11. The method of claim 1, wherein the estimating is performed on-line.

12. The method of claim 1, wherein the estimating is performed in nonlinear and adaptive forms.

13. The method of claim 1, wherein the estimating is performed using an extended Kalman filter.

14. A method for estimating a state of charge (SoC) a lithium-ion (Li+) battery at a time instant, comprising steps of:
   measuring a charge current, a discharge current, an open circuit voltage (OCV), and an output voltage during an off-line operation of the Li+ battery;
   constructing a battery model of the Li+ battery, wherein the battery model is constructed based on a single particle operation of the Li+ battery, where the battery model describes a relationship between, the charge current, the discharge current, and the OCV of the Li+ battery;
   partitioning parameters of the battery model into k sets, where each set of the parameters is identified by measuring different sets of data off-line; and
   determining each set of the parameters and the SoC sequentially by performing the measuring sequentially, wherein the steps are performed in a processor.

15. The method of claim 14, wherein the determining comprises
 determining k−1 sets of the parameters by their corresponding off-line measurements; and
 determining the $k^{th}$ set of the parameters and the SoC jointly by the $k^{th}$ on-line measurement.

* * * * *